United States Patent [19]

Matsunaga et al.

[11] Patent Number: 5,233,754
[45] Date of Patent: Aug. 10, 1993

[54] METHOD FOR FORMING PERFORATIONS ON A PRINTED CIRCUIT BOARD

[75] Inventors: Satoshi Matsunaga; Hirokazu Toyoda, both of Iruma, Japan

[73] Assignee: Nippon CMK Corp., Japan

[21] Appl. No.: 721,185

[22] Filed: Jun. 26, 1991

[30] Foreign Application Priority Data

Jun. 26, 1990 [JP] Japan ................................ 2-167926

[51] Int. Cl.$^5$ .............................................. H05K 3/02
[52] U.S. Cl. ...................................... 29/848; 29/413; 29/426.1; 29/846
[58] Field of Search ................. 29/413, 846, 848, 852, 29/426.1

[56] References Cited

U.S. PATENT DOCUMENTS 4,372,246  2/1983  Suzuki .............................. 29/413 X Primary Examiner—Carl J. Arbes
Attorney, Agent, or Firm—Bruce I. Adams; Van C. Wilks

[57] ABSTRACT

A method for forming perforations on a printed circuit board by means of press-working is disclosed. The perforations are used to facilitate the separation of a mother portion from the supplementary portions of a printed circuit board. The method is characterized in that the surface area of one side or both sides of the printed circuit board to be perforated is coated with copper film prior to the formation of the perforations in order to prevent cracks from forming around the perforations.

20 Claims, 1 Drawing Sheet

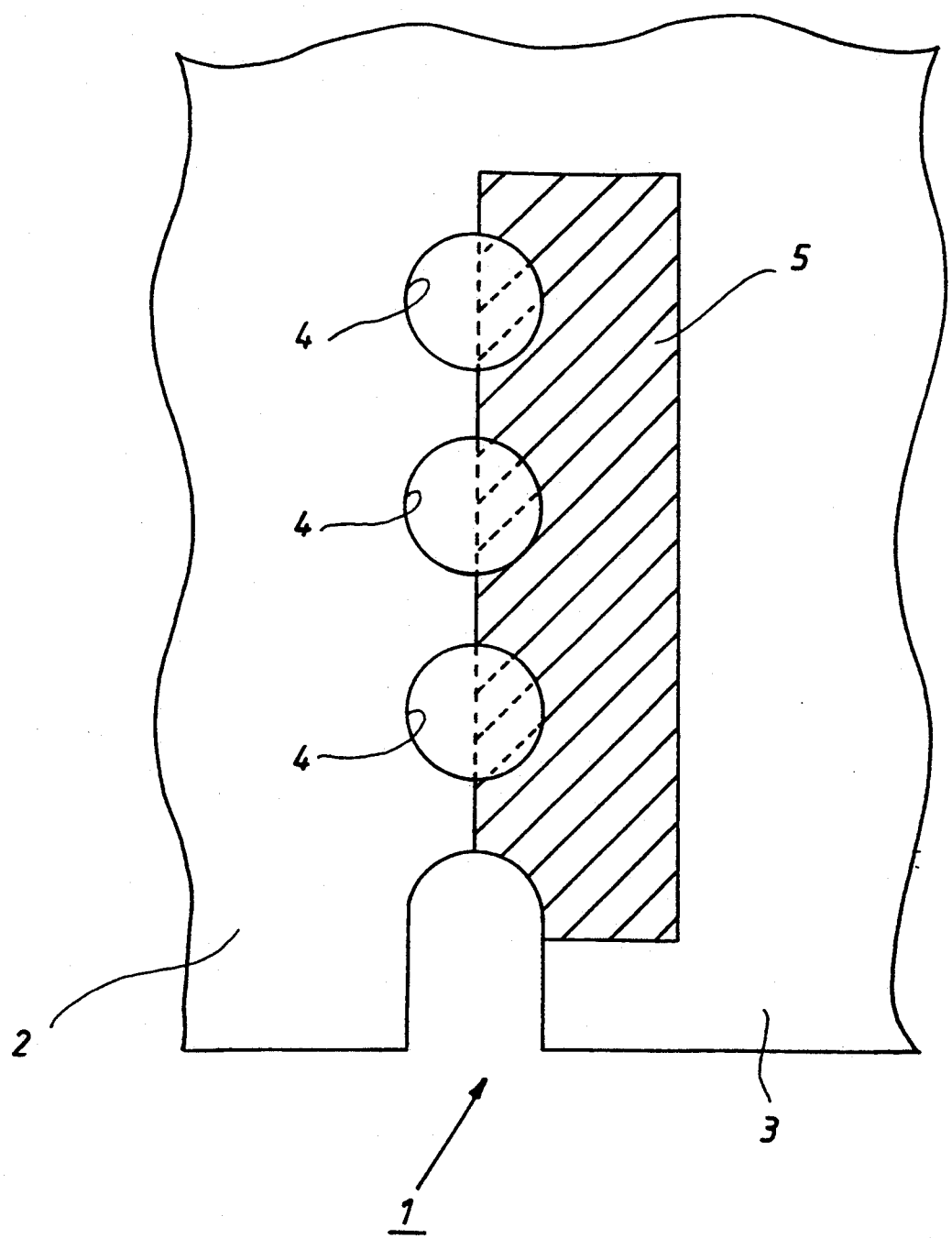

METHOD FOR FORMING PERFORATIONS ON A PRINTED CIRCUIT BOARD

BACKGROUND OF THE INVENTION

The present invention relates to a method for forming perforations on a printed circuit board consisting of a mother portion and supplementary portions to be separated from the mother portion.

When manufacturing printed circuit boards, perforations are formed on the board to make possible the separation of the supplementary portions from the mother portion.

In this case, the usual perforation process is to simultaneously punch a plurality of through holes along a line. This process often causes a serious strain along the line, the magnitude and orientation of which depends on the arrangement of the holes. This strain leads to the formation of cracks which renders the product defective and unacceptable.

There is a known method for manufacturing printed circuit boards that prevents such defects. Such a conventional method is disclosed, for example, in Japanese Patent No. H1-49031. The method employs a technique in which a metal mold punch is used to form waste holes in a neighboring supplementary portion at the same time that perforations are formed, thus preventing the neighboring supplementary portion from moving outwards, which in turn prevents the formation of cracks along the perforations or a premature separation of the supplementary portion.

However, the above conventional method requires that the structure of the conventional metal mold for press-working a printed circuit board be modified significantly in order to introduce such extra punches onto the structure. In addition, this increases the stress on the entire mold, thereby shortening the life of the mold.

SUMMARY OF THE INVENTION

The object of the present invention is to eliminate the above disadvantage associated with the conventional method for manufacturing a printed circuit board and to provide a method for forming perforations on a printed circuit board without modifying the conventional press-working procedure or causing any of the above problems.

The present invention provides a method for forming perforations on a printed circuit board by means of press-working, in which the perforations (used to facilitate the separation of the mother portion from the supplementary portions of the printed circuit board) are formed on the copper-film coated area of the printed circuit board by means of press-working in such a way that the copper film will prevent the formation of cracks around the perforations.

According to the above method for forming perforations on a printed circuit board by means of press-working, the copper film effectively absorbs the stress exerted when perforations are formed, protects the area around the perforations, prevents the formation of cracks around the perforations or premature separation between the supplementary and mother portions of the printed circuit board along the perforations, and improves the manufacturing yield on printed circuit boards.

These and other objectives, features, aspects, and advantages of the present invention will become more apparent from the following detailed description of the present invention when taken in conjunction with the accompanying drawing.

BRIEF DESCRIPTION OF THE DRAWING

The accompanying drawing is an enlarged view of a printed circuit board with perforations, and is an embodiment of the present invention.

DETAILED DESCRIPTION OF THE PREFERRED EMBODIMENT

The accompanying drawing is an enlarged view of a printed circuit board with perforations and is an embodiment of the present invention.

Referring to the figure, reference numeral 1 indicates a printed circuit board having opposed major surfaces. Reference numeral 2 indicates the mother portion of the printed circuit board, which has printed circuits formed on one or both major surfaces thereof.

Reference numeral 3 represents a supplementary portion to be separated from the mother portion (2) through the a line of perforations (4).

In the preferred embodiment, before forming perforations (4) by press-working, the area surrounding that were the perforations are to be formed is coated with a strain absorbing copper film (5) in a way such that the perforations will be formed on the copper film (5). Accordingly, when forming the perforations (4) by using a press mold (not shown) the copper film (5) can absorb both the strain produced by the punches and the tensile force exerted on the supplementary portion (3) in the direction of separation of the supplementary portion (3) from the mother portion (2). Accordingly, the copper film (5) effectively absorbs the strain produced during press-working and thereby serves to prevent both the formation of cracks around the perforations (4) and premature separation, of the supplementary portion (3) from the mother portion (2) which is possibly caused by external forces during or after the formation of perforations (4).

Although the copper film (5) covers half of each of the perforations (4) in the embodiment described above, it is equally possible to apply the copper film to completely coat the area surrounding the perforations to be formed. It is also possible to apply the copper film to coat the opposite side of the printed circuit board in a position corresponding to the copper film (5) on the first side.

The copper film (5) may be the remaining portion of the copper film formed and processed in the course of forming printed circuits on the mother portion (2). In this case, no extra copper coat is required.

We claim:

1. A method of making a perforated printed circuit board, comprising the steps: providing a printed circuit board having opposed major surfaces; applying a strain-absorbing film on one major surface of the printed circuit board at a location where perforations are to be formed in the board; and forming perforations in the printed circuit board with at least part of each perforation being formed on the strain-absorbing film, the strain-absorbing film being effective to absorb strain produced in the printed circuit board during formation of the perforations thereby preventing cracking of the board around the perforations.

2. A method according to claim 1; wherein the applying step comprises applying the strain-absorbing film along a line along which the printed circuit board is to be separated; and the forming step comprises forming perforations along the line.

3. A method according to claim 2; including separating the printed circuit board along the line of perforations.

4. A method according to claim 1; wherein the applying step comprises applying a strain-absorbing film on both major surfaces of the printed circuit board at opposed locations from each other corresponding to where perforations are to be formed in the board.

5. A method according to claim 4; wherein the perforations are formed on the opposed strain-absorbing films such that the perforations are completely surrounded by the films.

6. A method according to claim 5; wherein the strain-absorbing films comprise copper films.

7. A method according to claim 5; wherein the forming step comprises forming the perforations by press-working.

8. A method according to claim 7; wherein the press-working comprises press-molding.

9. A method according to claim 5; wherein the perforations have a circular shape.

10. A method according to claim 1; including applying a printed circuit film on the one major surface of the printed circuit board, the strain-absorbing film being applied in the same step and of the same material as that of the printed circuit film.

11. A method of making a perforated printed circuit board, comprising the steps: providing a printed circuit board having opposed major surfaces; forming perforations in the printed circuit board, the forming of the perforations producing strain in the printed circuit board in the regions immediately adjacent the perforations; and applying a strain-absorbing film on one major surface of the printed circuit board, prior to formation of the perforations and in the region where the perforations are to be formed, to effectively absorb strain produced during formation of the perforations and thereby prevent cracking of the printed circuit board around the perforations.

12. A method according to claims 11; wherein at least part of each perforation is formed on the film.

13. A method according to claim 11; wherein the perforations are formed on the film such that the perforations are completely surrounded by the film.

14. A method according to claim 11; wherein the applying step comprises applying the strain-absorbing film along a line along which the printed circuit board is to be separated; and the forming step comprises forming perforations along the line.

15. A method according to claim 14; including separating the printed circuit board along the line of perforations.

16. A method according to claim 11; wherein the applying step comprises applying a strain-absorbing film on both major surfaces of the printed circuit board at opposed locations from each other corresponding to where perforations are to be formed in the board.

17. A method according to claims 11; wherein the strain-absorbing film comprises a copper film.

18. A method according to claim 11; wherein the forming step comprises the perforations by press-working.

19. A method according to claim 11; including applying a printed circuit film on the one major surface of the printed circuit board, the strain-absorbing film being applied in the same step and of the same material as that of the printed circuit film.

20. A method according to claim 19; wherein the printed circuit film and the strain-absorbing film comprise a commonly formed copper film.

* * * * *